(12) United States Patent
Nakata et al.

(10) Patent No.: US 6,723,494 B2
(45) Date of Patent: Apr. 20, 2004

(54) CONDUCTOR PATTERN AND ELECTRONIC COMPONENT HAVING THE SAME

(75) Inventors: Yasuhiro Nakata, Fukui (JP); Keishiro Amaya, Fukui (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 39 days.

(21) Appl. No.: 09/903,792

(22) Filed: Jul. 12, 2001

(65) Prior Publication Data

US 2002/0048630 A1 Apr. 25, 2002

(30) Foreign Application Priority Data

Jul. 14, 2000 (JP) .......................................... 2000-214908

(51) Int. Cl.[7] ................................................. G03F 7/00
(52) U.S. Cl. ........................ 430/311; 430/198; 430/322; 430/330; 438/610; 438/669; 174/250
(58) Field of Search ................................. 430/198, 311, 430/322, 330; 438/610, 669; 174/250

(56) References Cited

U.S. PATENT DOCUMENTS 6,346,564 B1 * 2/2002 Kubota et al. ............... 524/403
6,407,345 B1 * 6/2002 Hirose et al. ................ 174/261
2002/0076657 A1 * 6/2002 Towata ........................ 430/322
2002/0094382 A1 * 7/2002 Imai et al. ................... 427/282

FOREIGN PATENT DOCUMENTS

| JP | 64-042110   |   | 2/1989  |
|----|-------------|---|---------|
| JP | 3-244181    | A | 10/1991 |
| JP | 10-106840   |   | 4/1998  |
| JP | 2000-040633 | A | 2/2000  |
| JP | 2000-068142 | A | 3/2000  |
| JP | 2000-150303 | A | 5/2000  |

OTHER PUBLICATIONS

"Thick Film Processes"; in Hybrid Microcircuit Technology Handbook, (Noyes, 1998), ch.4; pp. 104–171.*

* cited by examiner

*Primary Examiner*—Mark F. Huff
*Assistant Examiner*—K. Sagar
(74) *Attorney, Agent, or Firm*—Keating & Bennett, LLP (57) ABSTRACT

A conductor pattern is constructed to prevent corners from peeling and raising off a substrate. The conductor pattern has a spiral configuration and includes straight lines and corners connected to the straight lines. The bottom surface cross-sectional width of the conductor pattern is smaller than the top surface cross-sectional width thereof. Moreover, the bottom surface cross-sectional width of the corner is larger than the bottom surface cross-sectional width of the straight line.

14 Claims, 6 Drawing Sheets

CONDUCTOR PATTERN AND ELECTRONIC COMPONENT HAVING THE SAME

BACKGROUND OF THE INVENTION

1. Field of the Invention

The present invention relates to a conductor pattern and an electronic component including the conductor pattern.

2. Description of the Related Art

In a conventional conductor pattern for an inductor formed by printing conductive paste, a pattern with a small width cannot be obtained and is not suitable for an inductor having a small deviation. When manufacturing the inductor with a small deviation, a conductive thin film is formed by sputtering, a conductor pattern for an inductor is formed by the combination of photo-lithography and etching. Then, the film thickness is further increased by plating so as to form a conductor pattern for an inductor having a small deviation and a large Q value. The plating process has a problem, however, of a long throughput time and a greatly increased cost.

Recently, a method using photosensitive conductive paste has been proposed for forming a conductor pattern. In this method, photosensitive conductive paste is coated and a conductor pattern is formed thereon by exposing, developing, and burning it.

When a pattern width and space of the conductor pattern for forming an inductor are reduced and further when an aspect ratio is increased by an increase of the conductor thickness in order to obtain the required Q value and a DC resistance, a deficiency occurs in that a spiral corner of the conductor pattern for the inductor is peeled and raised off a substrate during burning. This occurs because of the cross-sectional shape and stress of contraction during the burning required when using photosensitive conductive paste.

Figure 14:
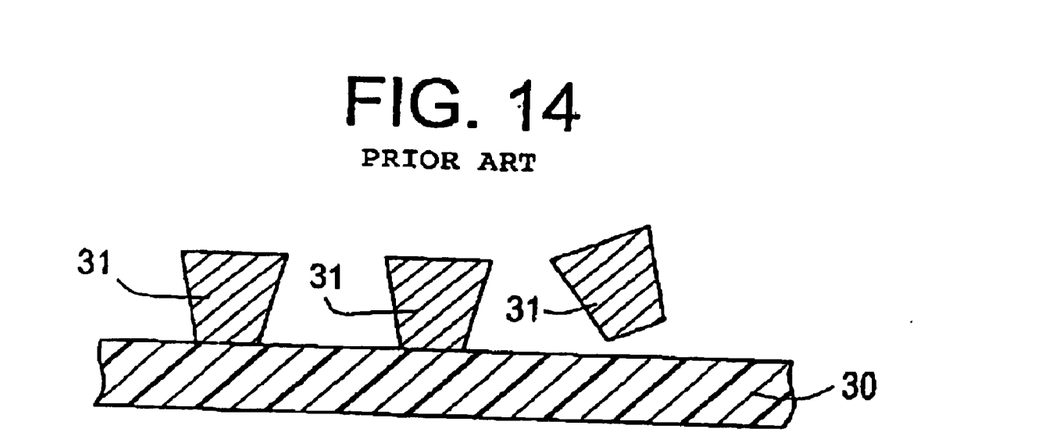
FIG. 14 is a cross-sectional view of a conventional conductor pattern.

That is, a light beam such as a UV beam is attenuated gradually in the photosensitive conductive paste, so that a bottom portion of the photosensitive conductive paste is difficult to be exposed. A photo-cured area is therefore reduced gradually toward a lower portion, and as shown in FIG. 14, a cross-sectional shape of a conductor pattern 31 after development is generally liable to be an inverted trapezoid. A contraction rate of the conductor pattern 31 after burning is approximately 70% and a contact area between a substrate 30 and the conductor pattern 31 is further reduced. Therefore, the contact area between the substrate 30 and the conductor pattern 31 is comparatively small and a joining strength between the substrate 30 and the conductor pattern 31 is also comparatively small.

Figure 15:
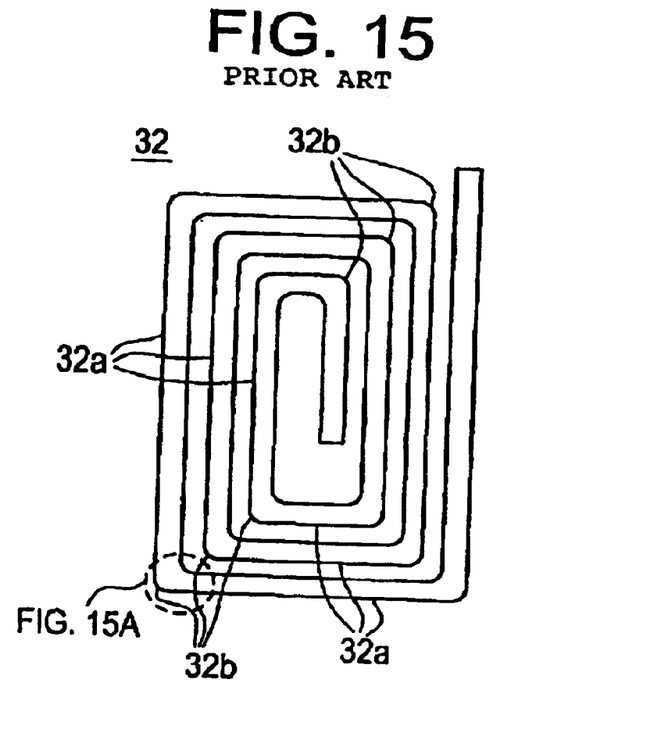
FIG. 15 is a plan view of the conductor pattern shown in FIG. 14.
Figure 15A:
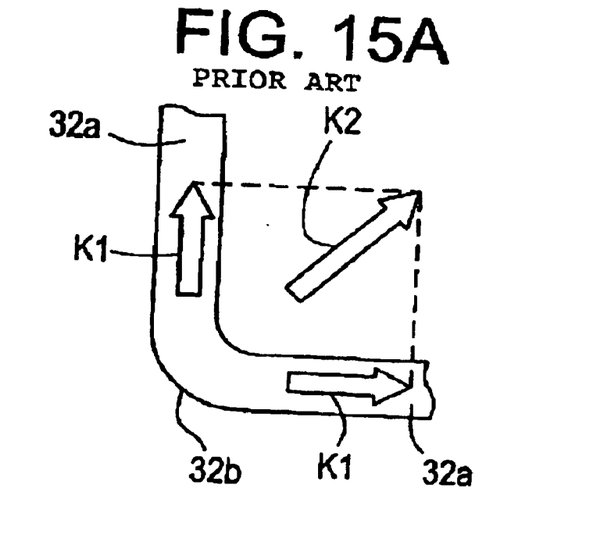
FIG. 15A is a plan view of a portion of the conductor pattern shown in FIG. 15.

On the other hand, for a conductor pattern 32 for the inductor having straight lines 32a and corners 32b shown in FIG. 15, a large contraction stress K1 is produced on the lines 32a during burning. On the corners 32b, a large tensile stress K2 is produced in the width direction of the pattern due to the contraction stress K1 of the straight line 32a, so that the corner 32b is likely to be peeled and raised off the substrate 30 (see the conductor pattern 31 on the right side of FIG. 14).

SUMMARY OF THE INVENTION

In order to solve the problems described above, preferred embodiments of the present invention provide a conductor pattern that prevents corners from peeling and raising off a substrate, and an electronic component including such an improved conductor pattern.

According to a preferred embodiment of the present invention, a conductor pattern according to the present invention is formed from photo-sensitive conductive paste coated on a surface of a substrate by exposing, developing, and burning the photo-sensitive conductive paste, and the conductor pattern includes straight lines and corners connected to the straight lines, wherein the bottom surface cross-sectional width of the conductor pattern is not larger than the top surface cross-sectional width thereof, and wherein the bottom surface cross-sectional width of each of the corners is larger than the bottom surface cross-sectional width of each of the straight lines.

More specifically, the bottom surface cross-sectional width of each of the corners may preferably be at least about 1.07 times, more preferably at least about 1.5 times, that of the conductor thickness of each of the corners. Furthermore, the bottom surface cross-sectional width of each of the straight lines may preferably be at least about 0.67 times that of the conductor thickness of each of the straight lines.

With the unique construction and structure described above, the bottom surface cross-sectional width of the corner is larger than the bottom surface cross-sectional width of the straight line, so that the contact area between the corner and a substrate is increased compared with conventional conductor pattern. Thereby, the problems with conventional conductor patterns are solved.

An electronic component according to another preferred embodiment of the present invention includes a conductor pattern formed from photo-sensitive conductive paste coated on a surface of a substrate by exposing, developing, and burning the photo-sensitive conductive paste, and the conductor pattern includes straight lines and corners connected to the straight lines, wherein the conductor pattern is any one of conductor patterns having the features described above with respect to the first preferred embodiment of the present invention.

Other features, elements, characteristics, and advantages of the present invention will become more apparent from the detailed description of preferred embodiments thereof with reference to the attached drawings.

DETAILED DESCRIPTION OF PREFERRED EMBODIMENTS

Preferred embodiments of a conductor pattern and an electronic component having the conductor pattern according to the present invention will be described below with reference to the attached drawings. Preferred embodiments will be described using a conductor pattern for an inductor and the inductor as examples. However, the present invention is not limited to inductors and may be applied to any electronic device including a conductor pattern.

Figure 1:
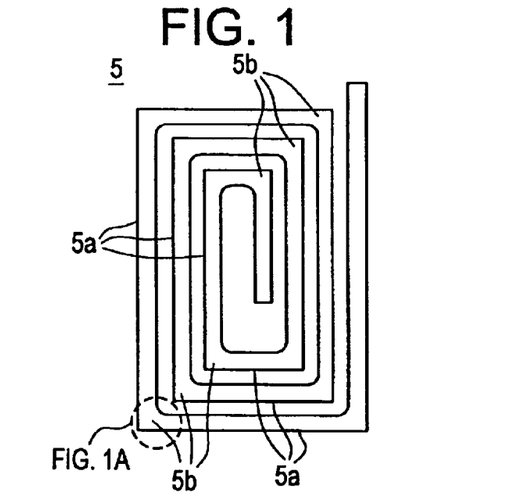
FIG. 1 is a plan view of a conductor pattern according to a preferred embodiment of the present invention.
Figure 1A:
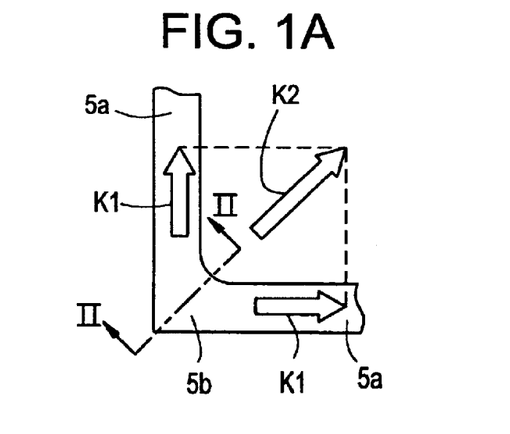
FIG. 1A is a plan view of a portion of the conductor pattern shown in FIG. 1.
Figure 2:
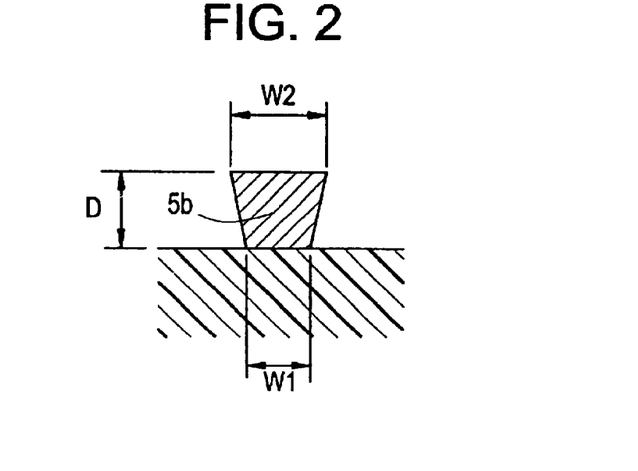
FIG. 2 is a cross-sectional view along the line II—II of FIG. 1.

As shown in FIG. 1, a conductor pattern 5 for an inductor preferably has a substantially spiral configuration and includes straight lines 5a and corners 5b connected to the straight lines 5a. As shown in FIG. 2, the cross-sectional bottom surface width W1 of the conductor pattern 5 for the inductor is substantially equal to or smaller than the top surface width W2 thereof. The bottom surface cross-sectional width W1 of the corner 5b is preferably larger than the bottom surface cross-sectional width W1 of the straight line 5a. Accordingly, the contact area between the corner and a substrate is greatly increased compared with conventional conductor. Thereby, the corner 5b of the conductor pattern 5 for the inductor is prevented from being peeled off or removed from the substrate during burning.

The conductor pattern 5 for the inductor is preferably formed as follows.

Figure 3:
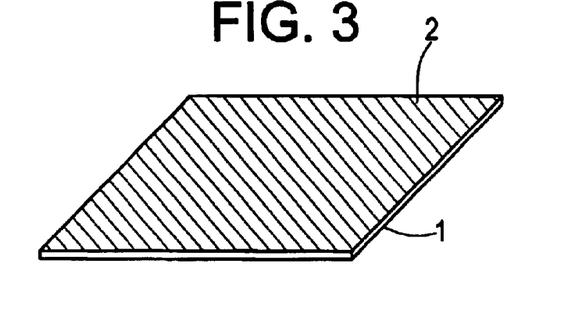
FIG. 3 is a perspective view of the conductor pattern shown in FIG. 1, showing a manufacturing process thereof.

As shown in FIG. 3, on the substantially entire top surface of a substrate 1, photosensitive conductive paste 2 is coated by a method such as a printing method and dried so as to form a film. In the present preferred embodiment, a targeted thickness of the photosensitive conductive paste 2 after drying is, for example, about 15 $\mu$m. The substrate 1 is preferably made from a material such as glass, glass ceramic, alumina, and ferrite, or other suitable material. For the photosensitive conductive paste 2, a material such as Ag or Cu is preferably used, although other suitable materials could be used.

Figure 4:
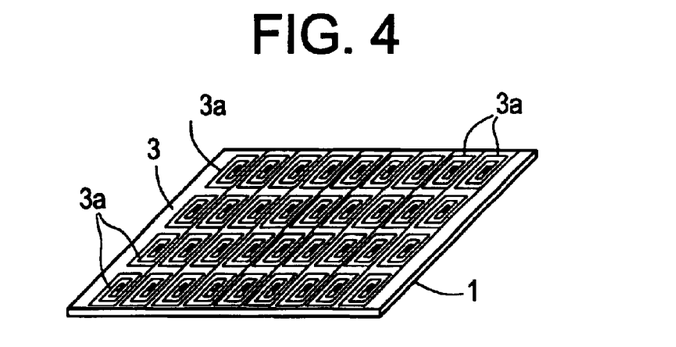
FIG. 4 is a perspective view showing a manufacturing process continued from that shown in FIG. 3.
Figure 5:
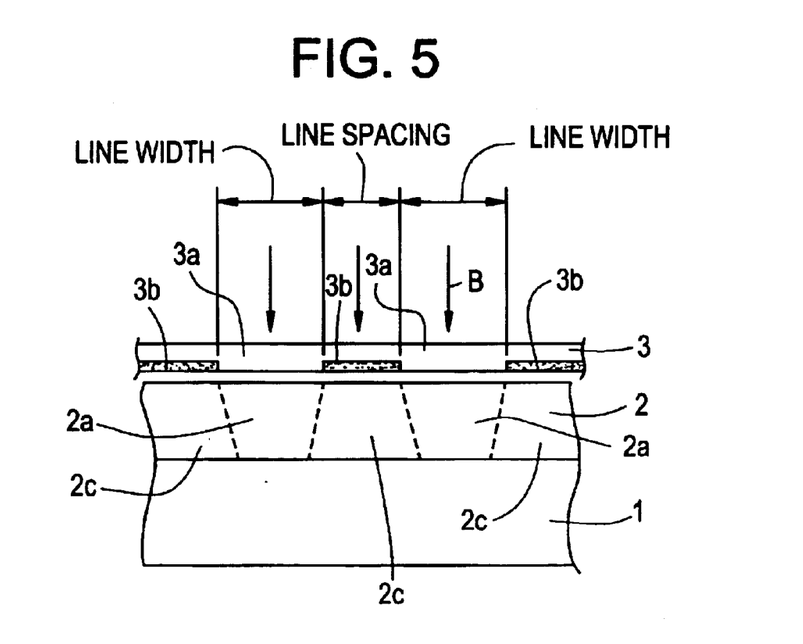
FIG. 5 is a cross-sectional view showing a manufacturing process continued from that shown in FIG. 4.

Then, as shown in FIGS. 4 and 5, on the top surface of the substrate 1, a photo-mask 3 having predetermined image patterns 3a formed thereon in a matrix arrangement is covered, and a UV beam B is applied thereto, so that a desired portion of the photosensitive conductive paste 2 is photo-cured (an exposure process). Since it is difficult for the UV beam B to reach a lower portion of the photosensitive conductive paste 2 at this time, as shown in FIG. 5, a photo-cured area 2a is gradually reduced along the thickness thereof. In addition, an area 2c from which the UV beam B is shielded by a non-light-transmissive portion 3b of the photo-mask 3 is a non-photo-cured area. In the image pattern 3a of the photo-mask 3, the width of the corner is larger than that of the straight line.

Figure 6:
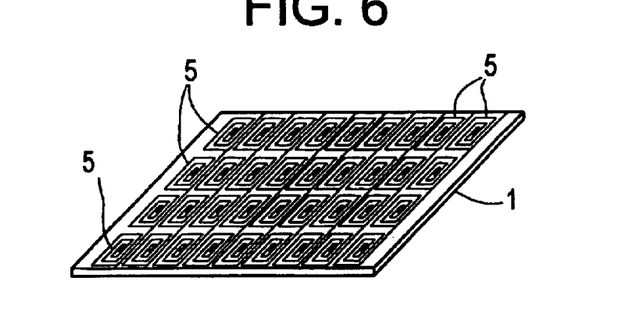
FIG. 6 is a perspective view showing a manufacturing process continued from that shown in FIG. 5.

Then, the photosensitive conductive paste 2 is developed by spraying liquid developer on the surface of the substrate 1. Thus, the non-photo-cured area 2c of the photosensitive conductive paste 2 is removed by the liquid developer. The residual photosensitive conductive paste 2 is arranged to define the substantially spiral conductor pattern 5 for the inductor. A cross-sectional shape of the conductor pattern 5 for the inductor is preferably a substantially inverted trapezoid. However, the shape may also be a substantially rectangular one. The conductor patterns 5 for the inductor are arranged on the surface of the substrate 1 in a matrix arrangement, as shown in FIG. 6.

Subsequently, the conductor patterns 5 for the inductor are burned by heat treatment at a high temperature (about 800° C., for example). At this time, as shown in FIG. 1, a large contraction stress K1 is produced on the straight line 5a of the conductor pattern 5. In the corner 5b, a large tensile stress K2 is generated due to the contraction stress K1. However, since the bottom surface cross-sectional width W1 of the corner 5b of the conductor pattern 5 is larger than the bottom surface cross-sectional width W1 of the straight line 5a so that a joining strength between the corner 5b and the substrate 1 is very large, even when the tensile stress K2 is applied thereto, the corner 5b cannot be peeled off the substrate 1.

Figure 7:
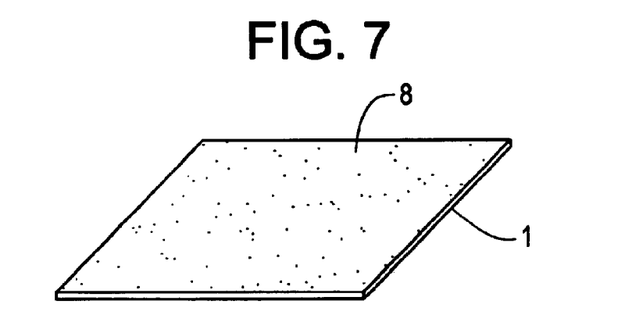
FIG. 7 is a perspective view showing a manufacturing process continued from that shown in FIG. 6.

Furthermore, as shown in FIG. 7, on the substantially entire top surface of the substrate 1 having the conductor patterns 5 for the inductor disposed thereon, photosensitive insulating paste 8 is coated preferably using a method such as a printing method and dried so as to form a film. For the photosensitive insulating paste 8, a material such as a polyimide resin is used.

Figure 8:
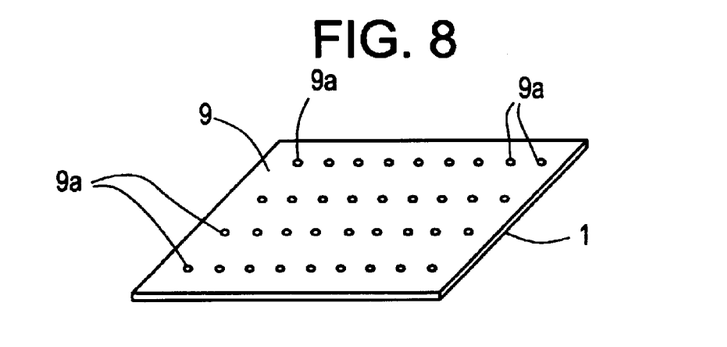
FIG. 8 is a perspective view showing a manufacturing process continued from that shown in FIG. 7.
Figure 9:
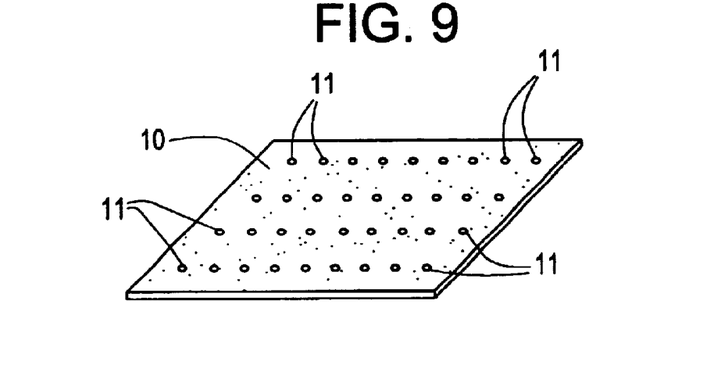
FIG. 9 is a perspective view showing a manufacturing process continued from that shown in FIG. 8.

Then, as shown in FIG. 8, on the top surface of the substrate 1, a photo-mask 9 having predetermined image patterns 9a formed thereon is covered, and a UV beam or other suitable light source is applied thereto, so that photosensitive insulating paste 8 except a portion of via holes is cured via an exposure process. Then, the substrate 1 is developed under substantially the same conditions as those of the conductor pattern 5 for the inductor. Thus, an unnecessary portion of the photosensitive insulating paste 8 is removed by liquid developer so as to form via holes 11 (see FIG. 9). The residual photosensitive insulating paste 8 is arranged to define an insulating film 10. Subsequently, the insulating film 10 having via holes 11 is fired by heat treatment at a high temperature. One end of the conductor patterns 5 for the inductor is exposed at the via hole 11.

Figure 10:
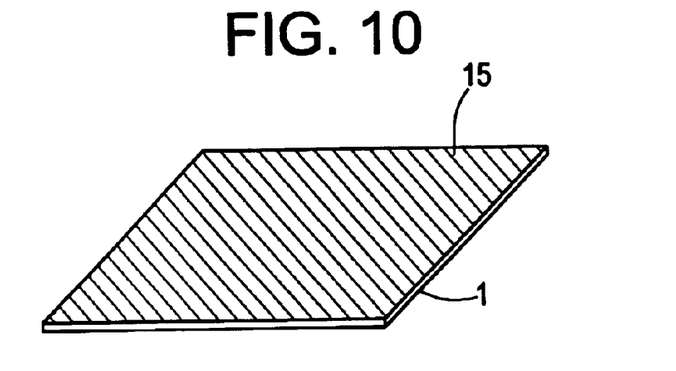
FIG. 10 is a perspective view showing a manufacturing process continued from that shown in FIG. 9.
Figure 11:
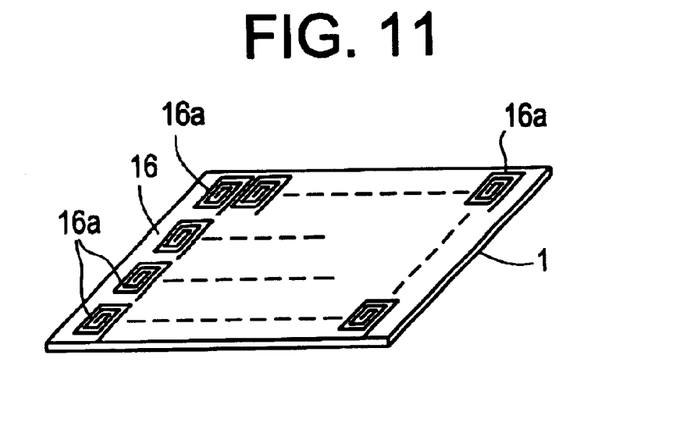
FIG. 11 is a perspective view showing a manufacturing process continued from that shown in FIG. 10.

Next, as shown in FIG. 10, on the substantially entire top surface of the insulating film 10 having the via holes 11 formed thereon, photosensitive conductive paste 15 is coated preferably by a method such as a printing method and dried so as to form a film. Then, as shown in FIG. 11, on the top surface of the substrate 1, a photo-mask 16 having predetermined image patterns 16a formed thereon in a matrix arrangement is covered, and a UV beam is applied thereto so that a desired portion of the photosensitive conductive paste 15 is cured via an exposure process.

Figure 12:
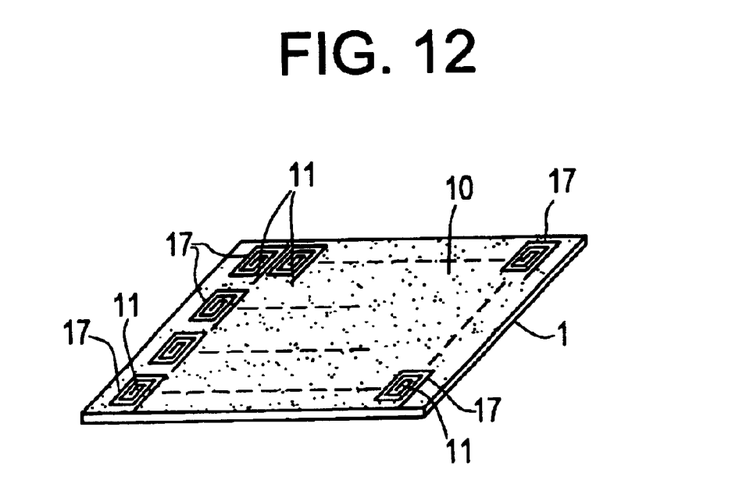
FIG. 12 is a perspective view showing a manufacturing process continued from that shown in FIG. 11.

Next, the substrate 1 is developed under the same conditions as those of the conductor pattern 5 for the inductor. Thus, an unnecessary portion of the photosensitive conductive paste 15 except the desired portion is removed by liquid developer (a developing process). The residual photosensitive conductive paste 15 is arranged to define the spiral conductor patterns 17 for the inductor as shown in FIG. 12. One end of each conductor pattern 17 for the inductor is electrically connected to the one end of each conductor pattern 5 for the inductor through the via hole 11.

Figure 13:
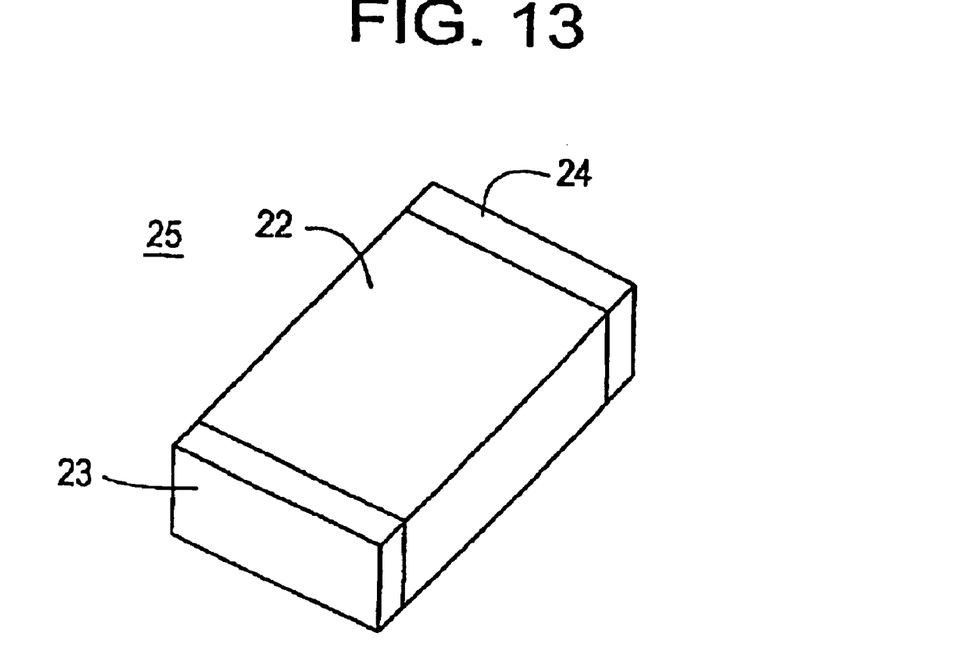
FIG. 13 is a perspective view showing a manufacturing process continued from that shown in FIG. 12.

In the same manner, the insulating film and the conductor pattern for the inductor are alternately deposited on each other. The conductor patterns 5 and 17 for the inductor are electrically connected in series through the via holes 11 formed in the insulating film 10 so as to define a coil. After depositing a protecting film on the top layer, the substrate 1 is cut into independent chip components. As is shown in FIG. 13, at both ends of the chip 22, external electrodes 23 and 24 are formed by using a method such as coating, sputtering, and wet plating, or other suitable method. The external electrodes 23 and 24 are connected to both ends of the coil, respectively. In such a manner, a multi-layer inductor 25 is obtained.

In addition, a conductor pattern and an electronic component including the conductor pattern according to various preferred embodiments of the present invention are limited to that described above, and instead, the conductor pattern and the electronic component including the conductor pattern may be modified within the scope of the present invention.

Preferred embodiments have been described above by using a conductor pattern for an inductor as an example. The present invention is not limited to this and the present invention can be applied to a conductor pattern such as a stripline pattern for various electronic components.

In the exposure processes of preferred embodiments described above, evaluation results of the conductor pattern 5 for the inductor are shown in Table 1, wherein in the image pattern 3a of the photo-mask 3, the exposures were performed when the line width of the straight line was about 25 $\mu$m and the space was about 15 $\mu$m, while patterns with various line widths of the corner were used. The evaluations of peeling of the corner 5b of the conductor pattern 5 were performed for the inductor during burning and evaluations of Q degradation of the obtained multi-layer inductor 25 were performed after wet-proof loading. The Q degradation was accepted when the Q value of the obtained multi-layer inductor 25 after wet-proof loading (70° C., 95% RH, 2000 Hrs) was within ±10% of the initial value. In Table 1, the evaluation results are also shown by way of comparison, in which exposure was performed when using an image pattern 3a having the same line widths of the corner and the straight line.

TABLE 1

|  | First Preferred Embodiment | Second Preferred Embodiment | Third Preferred Embodiment | Conventional Example |
|---|---|---|---|---|
| Cross-sectional size of straight line after burning ($\mu$m) |  | 19.6 / 10.5 / 9.1 |  |  |
| Cross-sectional size of corner after burning ($\mu$m) | 26.25 / 10.5 / 15.75 | 24.5 / 10.5 / 14 | 21.7 / 10.5 / 11.2 | 19.6 / 10.5 / 9.1 |
| Bottom face width/ Conductor thickness | 1.5 | 1.33 | 1.07 | 0.87 |
| Peeling | No | No | No | Yes |
| Q degradation after wetproof loading | 0/100 | 1/100 | 3/100 |  |

It is understood from Table 1 that when the bottom surface cross-sectional width W1 of the corner of the conductor pattern 5 for the inductor is about 1.07 times the conductor thickness D or more, peeling of the corner 5b is prevented and Q degradation is also minimized. In particular, when the bottom surface cross-sectional width W1 of the corner was about 1.5 times the conductor thickness D or more, Q degradation did not occur.

When the bottom surface width W1 of the straight line 5a of the conductor pattern 5 for the inductor is excessively reduced, meandering of the straight line 5a is liable to be generated after burning. In order to suppress the meandering, the relationship between the bottom surface width W1 of the straight line 5a and the conductor thickness D was evaluated. The evaluation results are shown in Table 2.

TABLE 2

|  | Fourth Preferred Embodiment | Fifth Preferred Embodiment |
|---|---|---|
| Cross-sectional size of corner after burning ($\mu$m) |  | 26.25 / 10.5 / 15.75 |
| Cross-sectional size of straight line after burning ($\mu$m) | 18.2 / 10.5 / 7.7 | 17.5 / 10.5 / 7 |
| Bottom face width/ Conductor thickness | 0.73 | 0.67 |
| Meandering | No | Yes |

It is understood from Table 2 that when the bottom surface width W1 of the straight line 5a is greater than approximately 0.67 times the conductor thickness D, the meandering of the straight line 5a is reliably prevented.

While the present invention has been particularly shown and described with reference to preferred embodiments thereof, it will be understood by those skilled in the art that the foregoing and other changes in form and details can be made without departing from the spirit and scope of the present invention.

What is claimed is:

1. A conductor pattern comprising:
   a plurality of straight lines; and
   a plurality of corners connected to the plurality of straight lines;
   wherein a bottom surface cross-sectional width of the conductor pattern is not larger than a top surface cross-sectional width thereof;
   a bottom surface cross-sectional width of each of the plurality of corners is larger than a bottom surface cross-sectional width of each of the plurality of straight lines; and
   the bottom surface cross-sectional width of each of the plurality of corners is at least about 1.07 times the conductor thickness of each of the plurality of corners.

2. A conductor pattern according to claim 1, wherein the bottom surface cross-sectional width of each of the plurality of corners is at least about 1.5 times the conductor thickness of each of the plurality of corners.

3. A conductor pattern according to claim 1, wherein the conductor pattern is made of photo-sensitive conductive paste.

4. A conductor pattern comprising:
   a plurality of straight lines; and a plurality of corners connected to the plurality of straight lines;

wherein a bottom surface cross-sectional width of the conductor pattern is not larger than a top surface cross-sectional width thereof;

a bottom surface cross-sectional width of each of the plurality of corners is larger than a bottom surface cross-sectional width of each of the plurality of straight lines; and the bottom surface cross-sectional width of each of the plurality of straight lines is at least about 0.67 times the conductor thickness of each of the plurality of straight lines.

5. An electronic component comprising:

a substrate; and at least one conductor pattern disposed on the substrate, the at least one conductor pattern including a plurality of straight lines and a plurality of corners connected to the plurality of straight lines;

wherein a bottom surface cross-sectional width of the conductor pattern is not larger than a top surface cross-sectional width thereof;

a bottom surface cross-sectional width of each of the plurality of corners is larger than a bottom surface cross-sectional width of each of the plurality of straight lines; and the bottom surface cross-sectional width of each of the plurality of corners is at least about 1.07 times the conductor thickness of each of the plurality of corners.

6. An electronic component according to claim 5, wherein the bottom surface cross-sectional width of each of the plurality of corners is at least about 1.5 times the conductor thickness of each of the plurality of corners.

7. An electronic component according to claim 5, wherein the conductor pattern is made of photo-sensitive conductive paste.

8. An electronic component comprising:

a substrate; and at least one conductor pattern disposed on the substrate, the at least one conductor pattern including a plurality of straight lines and a plurality of corners connected to the plurality of straight lines;

wherein a bottom surface cross-sectional width of the conductor pattern is not larger than a top surface cross-sectional width thereof;

a bottom surface cross-sectional width of each of the plurality of corners is larger than a bottom surface cross-sectional width of each of the plurality of straight lines; and the bottom surface cross-sectional width of each of the plurality of straight lines is at least about 0.67 times the conductor thickness of each of the plurality of straight lines.

9. A method of forming a conductor comprising the steps of:

forming a photo-sensitive conductive paste on a surface of a substrate;

exposing the photosensitive conductive paste;

developing the photosensitive conductive paste; and burning the photo-sensitive conductive paste to produce a conductor including a plurality of straight lines and a plurality of corners connected to the plurality of straight lines, wherein a bottom surface cross-sectional width of the conductor pattern is not larger than a top surface cross-sectional width thereof, and a bottom surface cross-sectional width of each of the plurality of corners is larger than a bottom surface cross-sectional width of each of the plurality of straight lines, and the bottom surface cross-sectional width of each of the plurality of corners is at least about 1.07 times the conductor thickness of each of the plurality of corners.

10. The method according to claim 9, wherein the bottom surface cross-sectional width of each of the plurality of corners is at least about 1.5 times the conductor thickness of each of the plurality of corners.

11. A method of forming a conductor comprising the steps of:

forming a photo-sensitive conductive paste on a surface of a substrate;

exposing the photosensitive conductive paste;

developing the photosensitive conductive paste; and burning the photo-sensitive conductive paste to produce a conductor including a plurality of straight lines and a plurality of corners connected to the plurality of straight lines, wherein a bottom surface cross-sectional width of the conductor pattern is not larger than a top surface cross-sectional width thereof, and a bottom surface cross-sectional width of each of the plurality of corners is larger than a bottom surface cross-sectional width of each of the plurality of straight lines, and the bottom surface cross-sectional width of each of the plurality of straight lines is at least about 0.67 times the conductor thickness of each of the plurality of straight lines.

12. A method of forming an electronic component the steps of:

providing a substrate;

forming at least one conductor on the substrate, the step of forming the at least one conductor including the steps of:

forming photo-sensitive conductive paste on a surface of a substrate;

exposing the photosensitive conductive paste;

developing the photosensitive conductive paste; and burning the photo-sensitive conductive paste to produce a conductor including a plurality of straight lines and a plurality of corners connected to the plurality of straight lines, wherein a bottom surface cross-sectional width of the conductor pattern is not larger than a top surface cross-sectional width thereof, and a bottom surface cross-sectional width of each of the plurality of corners is larger than a bottom surface cross-sectional width of each of the plurality of straight lines, and the bottom surface cross-sectional width of each of the plurality of corners is at least about 1.07 times the conductor thickness of each of the plurality of corners.

13. The method according to claim 12, wherein the bottom surface cross-sectional width of each of the plurality of corners is at least about 1.5 times the conductor thickness of each of the plurality of corners.

14. A method of forming an electronic component the steps of:

providing a substrate;

forming at least one conductor on the substrate, the step of forming the at least one conductor including the steps of:

forming photo-sensitive conductive paste on a surface of a substrate;

exposing the photosensitive conductive paste;

developing the photosensitive conductive paste; and
burning the photo-sensitive conductive paste to produce a conductor including a plurality of straight lines and a plurality of corners connected to the plurality of straight lines, wherein a bottom surface cross-sectional width of the conductor pattern is not larger than a top surface cross-sectional width thereof, and a bottom surface cross-sectional width of each of the plurality of corners is larger than a bottom surface cross-sectional width of each of the plurality of straight lines, and the bottom surface cross-sectional width of each of the plurality of straight lines is at least about 0.67 times the conductor thickness of each of the plurality of straight lines.

* * * * *